United States Patent [19]

Sanada et al.

[11] Patent Number: 4,820,619

[45] Date of Patent: Apr. 11, 1989

[54] PHOTOSENSITIVE RESIN COMPOSITION AND METHOD OF MANUFACTURING COLOR FILTER USING THE SAME

[75] Inventors: Shinichi Sanada, Yokohama; Masataka Miyamura, Kamakura, both of Japan

[73] Assignee: Kabushiki Kaisha Toshiba, Kawasaki, Japan

[21] Appl. No.: 933,215

[22] Filed: Nov. 21, 1986

[30] Foreign Application Priority Data

Nov. 29, 1985 [JP] Japan .................. 60-267220

[51] Int. Cl.$^4$ .............................. G03C 5/24
[52] U.S. Cl. ...................... 430/197; 430/7; 430/145; 430/197; 430/270; 430/294; 522/65; 522/152; 525/327.3; 525/376; 526/273
[58] Field of Search .............. 430/197, 270, 167, 294, 430/145, 7; 522/65, 152; 526/273; 525/327.5, 376

[56] References Cited

U.S. PATENT DOCUMENTS

| | | | |
|---|---|---|---|
| 4,299,911 | 11/1981 | Ochi | 430/197 |
| 4,388,397 | 6/1983 | Kanai | 430/197 |
| 4,401,745 | 8/1983 | Nakane et al. | 430/197 |
| 4,588,675 | 5/1986 | Nakane et al. | 430/197 |
| 4,590,149 | 5/1986 | Nakane et al. | 430/197 |
| 4,608,333 | 8/1986 | Ohbayashi et al. | 430/197 |
| 4,614,701 | 9/1986 | Mori et al. | 430/197 |
| 4,614,706 | 9/1986 | Matsuzawa et al. | 430/197 |

OTHER PUBLICATIONS

*Patent Abstracts of Japan*, vol. 8, No. 1, Mar. 3, 1984, pp. 258 [1485] JP-A-58 199 342, Sekisui Kagaku Kogyo, K.K., 19-11-1983.

*Patent Abstracts of Japan*, vol. 9, No. 1, Jan. 5, 1985, pp. 258, [1725] JP-A-59 155 412, Matsushita Denki Sangyo K.K., 04-09-1984.

*Chemical Abstracts*, vol. 83, No. 10, Sep. 8, 1975, pp. 668, Abstract No. 88745u, Columbus, OH, U.S.: SU-A-454 526, Y. I. Kol'TSOV et al., 25-12-1974.

*Chemical Abstracts*, vol. 83, No. 24, Dec. 15, 1975, p. 482, Abstract No. 200252j, Columbus, OH, U.S., JP-A-75 72 702, Kuraray Co., Ltd. 16-06-1975.

*Primary Examiner*—Jack P. Brammer
*Attorney, Agent, or Firm*—Oblon, Fisher, Spivak, McClelland & Maier

[57] ABSTRACT

A photosensitive resin composition contains a copolymer of a glycidyl (meth)acrylate or glycidyl (α-methyl)vinyl ether with a (meth)acrylic amide or ester having a quaternary ammonium salt structure, and an aromatic azide as a photosensitizer. A color filter can be prepared by coating the composition on a substrate, and exposing and developing the coated composition to form a pattern. The resultant pattern is then dyed.

9 Claims, 2 Drawing Sheets

PHOTOSENSITIVE RESIN COMPOSITION AND METHOD OF MANUFACTURING COLOR FILTER USING THE SAME

BACKGROUND OF THE INVENTION

1. Field of the Invention

The present invention relates to a photosensitive resin composition suitable for preparing a color filter used in a solid state color imaging device including a charge-coupled device (CCD), a bucket-brigade device (BBD) and a base store-type image sensor (BASIS), and in a contact type image sensor, a color display device, and the like. The present invention relates also to a method of manufacturing the color filter using the photosensitive resin composition.

2. Description of the Prior Art

In order to selectively radiate light of a specific wavelength on the surface of a solid-state imaging device such as a CCD, a color filter is formed thereon. The color filter is formed such that a photosensitive material is coated on a substrate, the coated photosensitive film is selectively exposed with light, the exposed film is developed, and the remaining pattern is dyed. The following materials have conventionally been used for forming such a color filter:

(a) a photosensitive composition wherein a dichromate as a photosensitizer is mixed in an animal protein such as gelatin, casein, or glue; and (b) a photosensitive composition wherein a dichromate or aromatic azide compound as a photosensitizer is mixed in a water-soluble polymer such as polyvinyl alcohol, polyacrylamide, or polyvinyl pyrrolidone.

The thickness and dyeing properties of a color filter having photosensitive composition (a) tend to vary since the animal protein in composition (a) is derived from a natural substance, and dark reactions are likely to occur. In addition, the dichromate may cause environmental pollution.

Photosensitive composition (b) has poor adhesion between the substrate and the photosensitive film formed therefrom. When the exposed film is developed, the film swells, thus resulting in degradation of resolution. Further, the composition cannot provide good heat-resistance or dyeing properties.

Japanese Patent Disclosure (Kokai) No. 59-155412 discloses a photosensitive resin composition obtained such that a water-soluble bisazide compound is mixed as a cross-linking agent with a terpolymer of N-vinyl-2-pyrrolidinone, a monomer having a quaternary ammonium structure and a polymerizable unsaturated bond, and an alkyl acrylate or an alkyl methacrylate. This composition has good dying properties but swells upon development. As a result, the resolution is degraded. In addition, a film of this composition has poor adhesion properties with respect to the substrate.

SUMMARY OF THE INVENTION

It is, therefore, an object of the present invention to provide a photosensitive resin composition which can provide a color filter having good adhesion properties with respect to a substrate, and good heat-resistance and dyeing properties, and which does not cause environmental pollution.

It is another object of the present invention to provide a method of manufacturing a color filter by using such a photosensitive resin composition.

In order to achieve the above objects of the present invention, there is provided a photosensitive resin composition comprising:

at least one copolymer of at least one glycidyl compound represented by the following general formula:

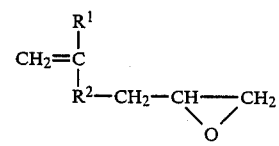

where
$R^1$ is a hydrogen atom or methyl group and $R^2$ is

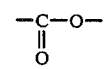

or —O—, with at least one comonomer selected from the group consisting of esters and amides of methacrylic and acrylic acids each having a quaternary ammonium salt structure; and a photosensitizer comprising an aromatic azide compound.

In order to prepare a color filter, the photosensitive resin composition of the present invention is coated on a substrate, a predetermined pattern is formed in the coated resin composition layer, and the pattern is dyed.

DETAILED DESCRIPTION OF THE PREFERRED EMBODIMENTS

Figure 1A:
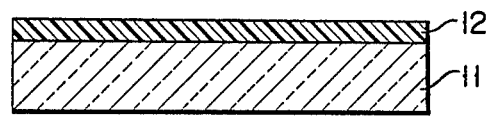
FIGS. 1A to 1E are sectional views for explaining the steps in manufacturing a color filter according to the present invention.

A photosensitive resin composition according to the present invention contains a copolymer of a glycidyl compound represented by the general formula:

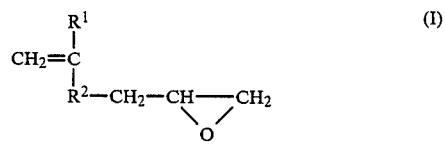
(I)

and a specific comonomer to be described later. The "copolymer" here is intended to include a binary, ternary or higher copolymer.

In formula (I), $R^1$ is a hydrogen atom or methyl group, and $R^2$ is

or —O—. Examples of the glycidyl compound represented by formula (I) are glycidyl acrylate, glycidyl methacrylate, glycidyl vinyl ether, and α-methylvinyl glycidyl ether. A mixture of two or more of these compounds may be used.

A comonomer polymerized with the glycidyl compound represented by formula (I) has a quaternary ammonium salt structure and is selected from the group consisting of esters and amides of methacrylic and acrylic acids each having the quaternary ammonium salt structure.

Examples of the comonomer are described by J. Macromol, Sci-Chem., A4(6), pp. 1329–1386 (1970), which may be used in the present invention. The most preferable comonomer is represented by the formula:

$$CH_2=C(R^3)-\overset{O}{\overset{\|}{C}}-X-R^4-\overset{\oplus}{N}(R^5)_3 Y^{\ominus}$$

where $R^3$ is a hydrogen atom or methyl group, $R^4$ is a lower (i.e., $C_1$-$C_8$) alkylene group or a lower hydroxyalkylene group, $R^5$ is a lower alkyl group, X is —O—, or —NH—, and $Y^{\ominus}$ is an anion. Examples of the suitable comonomer are:

(i) (meth)acryloyloxyethyltrimethylammonium chloride

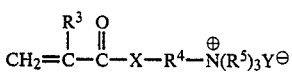

(ii) methacryloyloxypropyltriethylammonium bromode

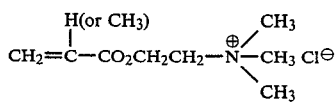

(iii) 2-hydroxy-3-methacryloyloxypropyltrimethylammonium chloride

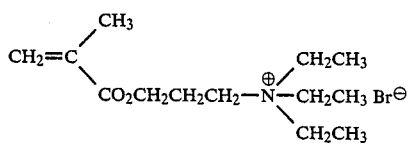

(iv) acryloylaminoethyltrimethylammonium chloride

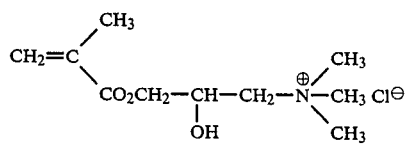

(v) methacryloylaminopropyltriethylammonium methylsulfonate

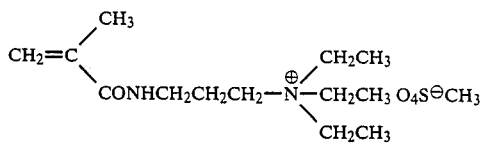

(vi) acryloylaminopropyltrimethylammonium chloride

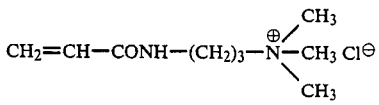

The content of the comonomer component in the above copolymer is preferably 5 to 80 mol %. If the content of the comonomer is less than 5 mol %, the dyeing properties are degraded so that it is difficult to obtain a required optical density. However, if the content of the comonomer exceeds 80 mol %, swelling occurs at the time of development or dyeing. The content of the comonomer is most preferably 10 to 50 mol %.

The above copolymer can be manufactured by an anion polymerization method, a cation polymerization method, or a radical polymerization method. In order to avoid side reactions including ring cleavage of the glycidyl group, radical polymerization is most preferable. to prepare the copolymer by the radical polymerization method, a mixture of the two types of monomers is copolymerized in a proper solvent in the presence of a polymerization initiator. The polymerization initiator is an azo-based polymerization initiator, e.g., azobisisobutyronitrile, azobiscyanovaleric acid, azobismethylisobutyrate or the like. The initiator is usually used in an amount of 0.1 to 5% by weight based on the total weight of the monomers used. Examples of the solvent are benzene, toluene, xylene, acetone, methyl ethyl ketone, cyclohexanone, dibutyl ether, dioxane, ethanol, methanol, isopropanol, n-butanol, diacetone alcohol, or a mixture thereof. The polymerization temperature is generally 0° C. to 120° C., and preferably 40° C. to 80° C. The polymerization time is 0.5 to 20 hours. A copolymer having a monomer unit molar ratio substantially corresponding to the molar ratio of the monomers can be obtained.

The above copolymer is stable and can be stored for three or more months in a dark cool place even if an aromatic azide compound as a cross-linking agent is mixed with the copolymer. The copolymer has film formation properties.

The sensitizer used in the composition of the present invention is an aromatic azide compound. Examples of the aromatic azide compound are 3,3'-diazidodiphenylsulfone, 4,4'-diazidodiphenyl ketone, 4,4'-diazidostilbene, 4,4'-diazidostilbene-2, 2'-sodium disulfonate, 2,6-bis(4'-azidobenzal)-4-methylcyclohexanone, 2,6-bis(4'-azidobenzal) cyclohexanone-2, 2'-sodium disulfonate, and 1,3-bis(4'-azidobenzal)-2-propanone.

The content of the aromatic azide compound is preferably 1 to 30% by weight of the total weight of the copolymer. If the content is less than 1%, the sensitizer function cannot be sufficiently effected. However, if the content exceeds 30%, light absorption in the visible light range after exposure and development is excessive, and the filter is excessively colored. The content of the aromatic azide compound is most preferably 2 to 10% by weight.

The photosensitive resin composition of the present invention as described above is a negative type resist material. Since the copolymer has a quaternary ammonium salt structure, good dyeing properties can be obtained. In addition, since the copolymer also contains a glycidyl group, strong adhesion of the copolymer layer with the substrate, a high resolution, and good heatresistance properties can be achieved. The copolymer further contains an aromatic azide compound and has good photosensitive properties.

One example of methods of manufacturing a color separation filter for a solid-state imaging device by using the photosensitive resin composition will be described with reference to FIGS. 1A to 1E.

As shown in FIG. 1A, the photosensitive resin material is uniformly coated by a spinner or the like on transparent substrate 11 such as a glass or acrylic plate to form resin layer 12 having a thickness of, e.g., 0.3 μm to 2.0 μm. Before coating, the photosensitive resin material is dissolved in ethyl Cellusolve, n-butyl Cellosolve, methyl Cellosolve acetate, ethyl Cellosolve acetate, diglime, methyl ethyl ketone, cyclohexanone, cyclopentanone, methyl isobutyl ketone, dioxane, isopropanol, diacetone alcohol, water, or a mixture thereof. After the resin material is coated on the substrate, the resin layer is prebaked at 50° C. to 180° C.

Figure 1B:

As shown in FIG. 1B, resin layer 12 is selectively exposed to light having a predetermined wavelength range (200 nm to 700 nm) through photomask 13.

Figure 1C:
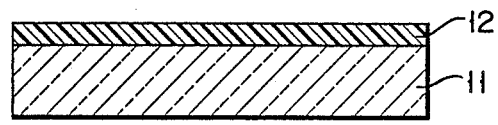

Thereafter, the resin layer pattern is developed by using the above solvent. Only the nonexposed portion of resin layer 12 is dissolved by the solvent, and exposed portion 12a remains as a pattern layer (FIG. 1C).

After pattern layer 12a is dried, it is dipped and dyed in a dyeing bath. The dye is preferably an acid dye, a direct dye, or a reactive dye. Examples of the dye are:

(i) Red Dyes

Aminyl Red E-2BL (available from SUMITOMO CHEMICAL CO., LTD.), Suminol Milling Red GG (available from SUMITOMO CHEMICAL CO., LTD.), Suminol Milling Brilliant Red RS (available from SUMITOMO CHEMICAL CO., LTD.), Kayanol Milling Red BW (available from NIPPO KAYAKU CO., LTD.), Cibacron Red F-B (available from Ciba-Geigy Corp.), Diacid Fast Red 3BL (available from Mitsubishi Chemical Industries Ltd.), etc.

(ii) Green Dyes

Mikacion Olive Green 3GS (available from Mitsubishi Chemical Industries Ltd.), Suminol Milling Brilliant Green 5G (available from SUMITOMO CHEMICAL CO., LTD.), Kayanol Milling Green 5GW (available from NIPPON KAYAKU CO., LTD.), etc.

(iii) Blue Dyes

Kayacion Turquoise P-NGF (available from NIPPON KAYAKU CO., LTD.), Mikacion Blue 3GS (available from Mitsubishi Chemical Industries Ltd.), Sumilight Supra Blue FGL (available from SUMITOMO CHEMICAL CO., LTD), Cibacron Blue B-E (available from Ciba-Geigy Corp.), Cibacrolan Blue 8G (available from Ciba-Geigy Corp.), etc.

(iv) Yellow Dyes

Kayanol Milling Yellow 5GW (available from NIPPON KAYAKU CO., LTD.), Suminol Milling Yellow MR (available from SUMITOMO CHEMICAL CO., LTD.), etc.

(v) Cyan Dyes

Kayanol Milling Turquoise Blue 3G (available from NIPPON KAYAKU CO., LTD.), Kayacyl Pure Blue FGA (available from NIPPO KAYAKU CO., LTD.), etc.

The pH of the dyeing bath is controlled to be 3 to 5 for conventional color filter materials, and these materials are dyed at high temperatures. However, it is difficult to saturate these materials with dyes. On the contrary, the composition of the present invention can be substantially saturated with a dyeing material within a short period of time (e.g., 1 minute to 10 minutes) at room temperature without intentionally adjusting the pH of the dyeing bath.

Figure 1D:
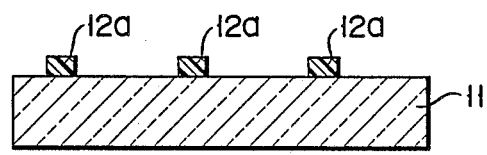

After dyeing is completed, the pattern layer is dried. Protective layer 14 (FIG. 1D) of a transparent resin such as acrylic resin is coated on the dried layer (FIG. 1D).

Figure 1E:
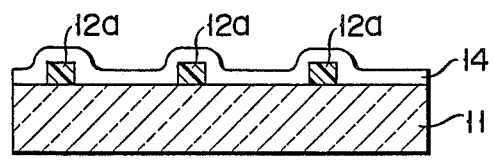

Coating, exposure, development, dyeing of the photosensitive resin material, and formation of the protective film can be repeated to prepare a color filter including, for example, three dyed pattern layers (FIG. 1E). For example, first pattern layer 12a is dyed in blue, second pattern layer 15 is dyed in red, and third pattern layer 16 formed on protective layer 17 is dyed in green. In this case, the dyed patterns do not overlap each other. Third pattern layer 16 is covered with transparent resin layer 18 having a flat outer surface.

The photosensitive resin composition of the present invention has good resolution properties, and a lineandspace pattern of 2 μm or less can be formed. This pattern has good heat-resistance properties such that it can withstand high temperatures up to 180° C.

The resultant color filter is adhered to a solidstate imaging device. In the above embodiment, the color filter is formed on a separate transparent substrate, and the integral body formed is adhered to the solid-state imaging device. However, a color filter may be directly formed on a solid-state imaging device by using the photosensitive resin composition of the present invention.

The present invention will be described below in detail by way of examples.

EXAMPLE 1

The following four materials were put into a three neck flask:

Acryloyloxyethyltrimethylammonium chloride 40.7 g

Glycidylmethacrylate 70.7 g

Azobisisobutyronitrile 0.2 g

Methanol 500 ml

The mixture was subjected to nitrogen substitution for an hour. Thereafter, the mixture was heated to 60° C., and stirred for 6 hours to perform polymerization. When polymerization was completed, precipitation was performed by using a large amount of ethyl acetate. The precipitate was washed with petroleum ether and dried at a reduced pressure, thus obtaining 48.6 g (a 45% yield) of a milky white powder. This powder was subjected to elemental analysis, IR and NMR analyses, and was found to be a copolymer containing 69.3 mol % of glycidyl me thacrylate. A molecular weight $\overline{Mn}/$ was 35,000, and a dispersion $\overline{MW}/\overline{Mn}$ ratio was 1.45.

Ten grams of the above polymer and 0.5 g of 3,3'-diazidodiphenylsulfone were dissolved in 100 ml of cyclohexanone to prepard a resist solution. The resist solution was spin-coated on a transparent substrate at 4,000 rpm for 50 seconds to form resist layer 12, having a thickness of 0.5 μm, as shown in FIG. 1A.

Resist layer 12 was prebaked at 85° C. for 15 minutes and then exposed with far-ultraviolet rays from a light source of a xenon-mercury lamp (500 W) through mask 13, as shown in FIG. 1B. The exposed layer was developed by methyl ethyl ketone at room temperature and rinsed by n-hexane. The pattern was dried in an oven at 150° C. for 30 minutes to obtain pattern 12a having a thickness of 0.45 μm, as shown in FIG. 1C. In this case, no pattern defects caused by peeling of the resist layer were found. Deformation of the pattern by heat did not occur. It was thus found that the pattern had good adhesion and heat-resistance properties. In the above process, resist layer 12 has a resolution of 2.0 μm, and the pattern was found to have a high resolution.

Pattern layer 12a was dipped in an aqueous solution dissolving (1% by weight of a blue acid dye of Cibacrolan Blue 8G, available from Ciba-Geigy Corp.) at room temperature for 5 minutes. The optical density of the dye in the dyed pattern layer was measured to be 1.8 by spectroscopic measurement. The resultant color filter was found to have good dyeing properties.

Transparent polymethylmetacrylate was spin-coated on substrate 11 including dyed pattern layer 12a to form protective layer 14 having a thickness of 1.0 μm, as shown in FIG. 1D. Thereafter, red pattern layer 15, protective layer 17, green pattern layer 16, and top coating transparent resin layer 18 were formed in the same manner as described above, thereby preparing a solid-state imaging device color separation filter shown in FIG. 1E.

EXAMPLE 2

Following the same procedures as in Example 1 except that 29.1 g of methacryloyloxyethyltrimethylammonium chloride were used in place of 40.7 g of acryloyloxyethyltrimethylammonium chloride, a copolymer was prepared. The yield was 68.4 g (63%). Element, IR, and NMR analyses were performed to find the copolymer as a copolymer containing 79.8 mol % of glycidyl methacrylate.

Following the same procedures as in Example 1, the copolymer was used to prepare a color separation filter. The resolution of the copolymer was as high as 1.9 μm, and the optical density of the dye after dyeing of the polymer was as high as 1.3.

EXAMPLE 3

Following the same procedures as in Example 1 except that 2 g of 4,4'-diazidostilbene were used in place of 2 g of 3,3'-diazidodiphenylsulfone, a 1-μm resist film was spin-coated. The resist film was exposed to light from a high-pressure mercury lamp (1 kW), and the exposed film was developed to obtain a pattern having a thickness of 0.85 μm and a resolution of 2 μm. The pattern layer was dipped in an aqueous dye solution at room temperature for 5 minutes. This aqueous dye solution was obtained by dissolving 1% by weight of Mitsui Acid Milling Turquoise Blue 3G available from Mitsui Toatsu Co. as a direct dye in water. The dyed layer had an optical density of 2.4.

COMPARATIVE EXAMPLE 1

An aqueous solution containing 15% by weight of low molecular weight gelatin ($\overline{Mw}=1.7\times10^4$; $\overline{Mw}/\overline{Mn}=2.5$) and 20% by weight, based on the weight of the gelatin, of ammonium dichromate was heated at 35° C. The solution was spin-coated on a substrate to form a 1-μm thick film. This film was prebaked at 70° C. for 6 minutes. Thereafter, the film was exposed to farultraviolet rays from a light source of a xenon-mercury lamp (500 W). After the exposure, the film was developed with warm water at 40° C. The developed film was post-baked at 80° C. for 6 minutes to form a 0.9-μm thick pattern. The pattern had a resolution of 6 μm. Following the same procedures as in Example 1, the pattern was dyed at room temperature, and the optical density of the dye was 0. The pattern was dyed at 60° C. for 10 minutes, and the resultant optical density was 0.3.

COMPARATIVE EXAMPLE 2

The following resist material were mixed:
N-vinyl-2-pyrrolidinone—30.0 g
2-hydroxy-3-methacryloxypropyltrimethylammonium chloride—10.0 g
Methyl methacrylate—15.0 g
Azobisisobutyronitrile—0.2 g
Methanol—250 ml and the resultant mixture was put into a three neck flask, and the interior of the flast was substituted with nitrogen for an hour. The mixture was heated to 65° C. and stirred for 6 hours to perform its polymerization. When the polymerization was completed, precipitation was performed by using a large amount of ethyl acetate. The precipitate was washed with petroleum ether and dried at a low pressure. The dried precipitate was dissolved in water, and 5 mg of 4,4'-diazidostilbene-2,2'-disodium sulfonate were added as a cross-linking agent with respect to 1 g of the resin.

The resultant resist solution was spin-coated on a substrate to form a 0.5-μm thick resist layer. The resist layer was exposed to ultraviolet rays and developed with water at 25° C. for 30 seconds. Swelling occurred at the micropattern portions, and the resultion was 9 μm.

EXAMPLE 4

Following the same procedures as in Example 1, glycidyl methacrylate (GMA) was polymerized with acryloylaminopropyltrimethylammonium chloride (TPC), acryloyloxyethyltrimethylammonium chloride (TAC), or methacryloyloxyethyltrimethylammonium chloride (TMC), by using azobisisobutyronitrile as a polymerization initiator at 60° C. for polymerization times shown in Table 1 to prepare desired copolymers. The yields, GMA mol %, and molecular weights of the copolymers are summarized in Table 1.

TABLE 1

| Monomer | Reaction time (H) | Yield | GMA mol % in co-polymer | Mol. weight | |
|---|---|---|---|---|---|
| | | | | Mn ($\times 10^4$) | Mw/Mn |
| GMA—TPC | 9 | 63% | 49 | 3.6 | 1.3 |
| GMA—TAC | 12 | 81% | 71 | 3.3 | 1.4 |

TABLE 1-continued

| Monomer | Reaction time (H) | Yield | GMA mol % in co-polymer | Mol. weight Mn (× 10⁴) | Mw/ Mn |
|---|---|---|---|---|---|
| GMA—TMC | 15 | 72% | 73 | 3.5 | 1.5 |

The above copolymers were dissolved together with the respective sensitizers to prepare three resist solutions, as shown in Table 2. Following the same procedures as in Example 1, color filters were prepared.

TABLE 2

|  | A | B | C |
|---|---|---|---|
| Copolymer | GMA—TPC | GMA—TAC | GMA—TMC |
| Polymer cont. (%) | 26 | 10 | 10 |
| Sensitizer | Azide A* | Azide B** | Azide B** |
| Sensitizer cont. (%) | 1.3 | 0.5 | 0.5 |
| Solvent | Isopropanol-water | Cyclohexanone | Cyclohexanone |

*Azide A

**Azide B
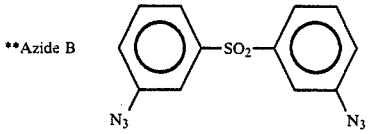

Figure 2:
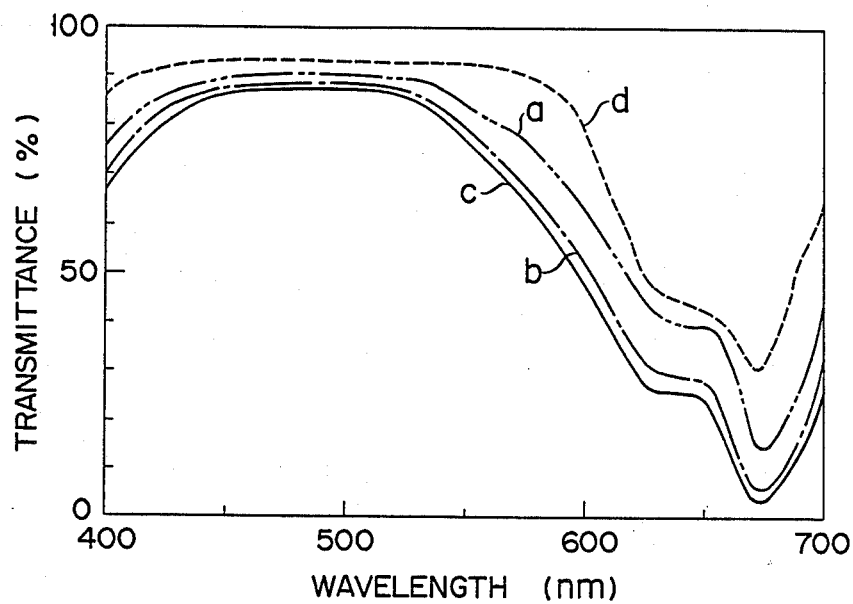
FIGS. 2 and 3 are graphs showing characteristics of a color filter prepared according to the present invention, together with those obtained in the comparative examples.

A filmof resist A was dipped in an aqueous solution (pH 4.5) containing 0.1% by weight of Direct Cyanine Blue at 20° C., and transmittances of light having different wavelengths passing through the dyed filter were measured. The results are shown in FIG. 2. Curve a in FIG. 2 shows the case wherein the film is dipped for 20 seconds; curve b, for 45 seconds; and curve c, for 60 seconds. As a comparative example, a conventional gelatin-ammonium dichromate resist film was dipped in a dyeing solution having the same composition as described above at 50° C. for 20 minutes, and the characteristics of the resultant color filter are represented by curve d.

Figure 3:
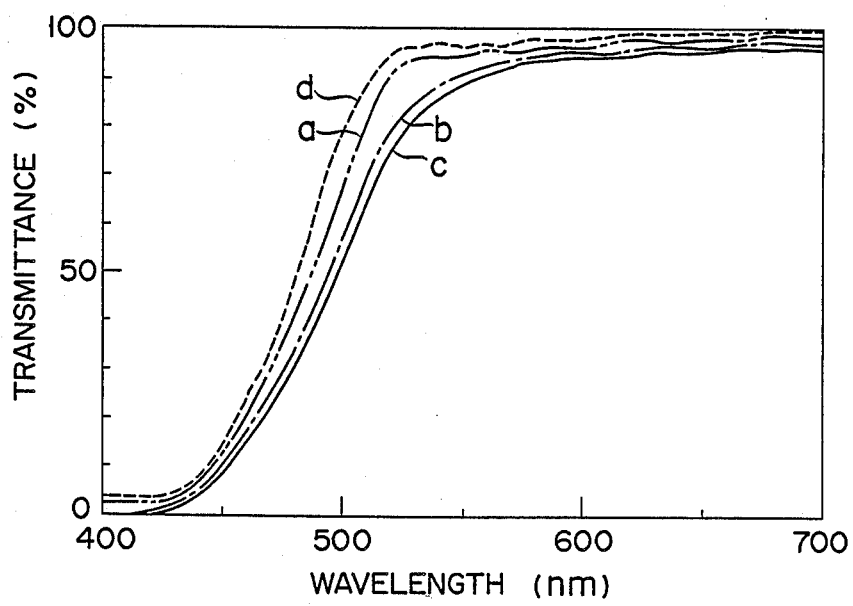

A film of resist A was dipped in an aqueous solution (pH 4.6) containing 1.0% by weight of Acid Yellow at 20° C., and transmittances of light having different wavelengths passing through the dyed filter were measured. The results are shown in FIG. 3. Curve a in FIG. 3 shows the case wherein the film is dipped for 5 minutes; curve b, for 8 minutes; and curve c, for 10 minutes. As a comparative example, a conventional gelatin-ammonium dichromate resist film was dipped in a dyeing solution having the same composition as described above at 50° C. for 20 minutes, and the characteristics of the resultant color filter are represented by curve d.

As is apparent from FIGS. 2 and 3, the resist material of the present invention can be dyed under more moderate conditions than those of the conventional gelatin-based resist.

As described in detail above, according to the present invention, there is provided a photosensitive resin composition having strong adhesion to the substrate, and heat-resistance and dyeing properties. Therefore, a high-performance color filter can be prepared by using this composition.

What is claimed is:

1. A photosensitive resin composition consisting essentially of:
   at least one copolymer consisting essentially of at least one glycidyl compound represented by the following general formula

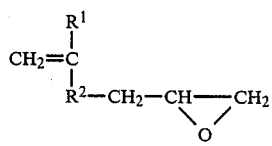

where
R¹ is hydrogen atom or methyl group, and R² is

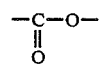

or —O—, with 5 to 80 mol % of at least one comonomer selected from the group consisting of esters and amides of methacrylic and acrylic acids each having a quaternary ammonium salt structure; and
   a photosensitizer comprising an aromatic azide compound in an amount effective to sensitize said copolymer.

2. The composition according to claim 1, wherein the copolymer contains 10 to 50 mol % of the comonomer unit.

3. The composition according to claim 1, wherein the glycidyl compound is selected from the group consisting of glycidyl acrylate, glycidyl methacrylate, glycidyl vinylether, α-methylvinyl glycidyl ether, or a mixture thereof.

4. The composition according to claim 1, wherein the comonomer is represented by the following general formula:

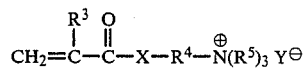

where R³ is hydrogen atom or methyl group, R⁴ is a lower alkylene group or a lower hydroxyalkylene group, R5 is a lower alkyl group, X is —O— or —NH—, and Y⊖ is an anion.

5. The composition according to claim 4, wherein the comonomer is selected from the group consisting of (meth)acryloyloxyethyltrimethylammonium chloride, methacryloyloxypropyltriethylammonium bromide, 2-hydroxy3-methacryloyloxypropyltrimethylammonium chloride, acryloylaminoethyltrimethylammonium chloride, methacryloylaminopropyltriethylammonium methylsulfonate, acryloylaminopropyltrimethylammonium chloride, or a mixture thereof.

6. The composition according to claim 1, wherein the aromatic azide compound is selected from the group consisting of 3,3'-diazidodiphenylsulfone, 4,4'-diazidodiphenyl ketone, 4,4'-diazidostilbene, 4,4'-diazidostilbene-2,2'-sodium disulfonate, 2,6-bis(4'-azidobenzal)-4-methylcyclohexanone, 2,6-bis(4'-azidobenzal)-cyclohexanone-2,2-sodium disulfonate, 1,3-bis(4'-azidobenzal)-2-propanone, or a mixture thereof.

7. The composition according to claim 1, wherein the sensitizer is contained in an amount of 1 to 30% by weight based on the total weight of the copolymer.

8. The composition according to claim 7, wherein the sensitizer is contained in an amount of 2 to 10% by weight based on the total weight of the copolymer.

9. The composition according to claim 1, wherein the copolymer has film forming properties.

* * * * *